United States Patent [19]

Chilluffo et al.

[11] Patent Number: 4,799,035
[45] Date of Patent: Jan. 17, 1989

[54] MICROWAVE DIODE TUNING CIRCUIT

[75] Inventors: Ronald L. Chilluffo, Coral Springs; Ellis J. Gottlieb, Palm Beach, both of Fla.

[73] Assignee: Allied-Signal Inc., Morristown, N.J.

[21] Appl. No.: 117,597

[22] Filed: Nov. 6, 1987

[51] Int. Cl.⁴ .............................. H01P 7/08; H01P 3/08
[52] U.S. Cl. .................................... 333/223; 333/219; 333/235; 333/247
[58] Field of Search ........ 333/204, 205, 219, 222–225, 333/245–247, 250, 235, 206, 207, 213, 202, 208–212; 331/96, 56, 101, 102, 107 R, 107 D, 107 P, 107 S, 107 L, 107 C; 334/41–45; 455/124, 198, 281, 318, 319, 325, 327, 328, 330

[56] References Cited

U.S. PATENT DOCUMENTS 2,734,170 2/1956 Engelmann et al. ........... 333/250 X

OTHER PUBLICATIONS

Hu et al-"A Broad-Band, Low Noise Receiver at W-- Band" Conference: 1981 IEEE MTT-S International Microwave Symposium Digest, Los Angeles, CA., U.S.A. (Jun. 15-19, 1981); pp. 111-113.

Primary Examiner—Marvin L. Nussbaum
Attorney, Agent, or Firm—B. L. Lamb; R. M. Trepp

[57] ABSTRACT

A microwave diode tuning circuit including am IM- PATT diode holder of coaxial form and an adjustable capacitor connected in a parallel resonant circuit by microstrip transmission line. The tuning circuit includes a stabilization network and a bias insertion network. Optionally, the tuning circuit may include a hybrid junction for coupling two such diode tuning circuits together. the diode holder includes an internally-externally threaded sleeve providing means for continuously adjusting, through a limited range, the inductance of the resonant circuit.

13 Claims, 4 Drawing Sheets

MICROWAVE DIODE TUNING CIRCUIT

The present invention relates to microwave tuning circuits utilizing negative resistance devices as the active element. More specifically, it relates to a coaxial-microstrip tuning circuit for an IMPATT diode.

The most cmmonly used tuning circuits for microwave diodes which provide for combining the outputs of several such diodes to achieve an output at substantial power level are of the coaxial tuner-resonant cavity combiner type. Such circuits are exemplified by U.S. Pat. No. 4,468,633 issued Aug. 28, 1984 to R.L. Chilluffo et al. and U.S. Pat. No. 4,359,700 issued Nov. 16, 1982 to C.P. Tresselt; both of which patents are assigned to the assignee of the present application. Further examples of coaxial-resonant cavity tuner-combiner circuits are U.S. Pat. No. 4,097,821 issued June 27, 1978 to J. L. Lampen et al.

The disadvantages of such tuner-combiner circuits include the comparative massiveness of their structure, their expense and the difficulty of tuning the individual diodes for optimum combined output. The massiveness of the structure arises from the necessity to maintain high dimensional stability in waveguide resonant cavity. The expense arises from the necessity to machine such structures to highly precise dimensions and the difficulty of tuning results from the interaction between the tuning circuits through the commonly shared resonant cavity.

Coaxial-microstrip tuner-combiner circuits are superior to coaxial-cavity tuner-combiner with respect to massiveness, cost and ease of tuning of the individual diodes. Microstrip circuits are dimensionally stable. They can be produced with a high degree of precision at moderate cost using printed circuit methods and they can be designed to provide a high degree of isolation between active devices thereby simplifying tuning of the individual devices.

A prior coaxial-microstrip tuner-combiner included a coaxial IMPATT diode holder coupled to an adjustable capacitor through an impedance matching length of microstrip. Coarse inductive tuning of the diode was accomplished by inserting transformer sections of various lengths in series with the diode. Fine tuning was accomplished by adjustment of the capacitor which was continuously variable through a limited range. Adjustment of tuning in such an arrangement is time consuming since it is necessary to remove and reinsert the diode while various transformer lengths are inserted in the holder until the diode is brought within the range tunable by the capacitor. Also, certain diodes could not be tuned with the limited number of transformer sections available, resulting in the rejection of otherwise usable diodes.

It is an object of the invention to provide a coaxial-microstrip tuner-combiner circuit for IMPATT diodes in which tuning of the diode is simplified and made less time consuming.

It is another object of the invention to provide a coaxial-microstrip tuner circuit for IMPATT diodes which includes means for suppressing unwanted modes of oscillation of the diode.

It is a further object of the invention to provide a coaxial-microstrip tuner circuit for IMPATT diodes in which the diode may be inductively tuned continuously through a limited range.

BRIEF DESCRIPTION

Briefly, the invention comprises a coaxial IMPATT diode holder and an adjustable capacitor connected in a parallel resonant circuit through an impedance matching length of microstrip. Beyond the resonant circuit the microstrip includes a stabilization network for reducing out of band frequencies, a bias insertion network and a hybrid junction for coupling two such diode tuning networks together. The diode holder includes a threaded center conductor upon which the diode is mounted and an internally-externally threaded sleeve which supports the center conductor and diode in a mounting block. The mounting block corresponds to the outer conductor of a coaxial transmission line and the threaded rod corresponds to the inner conductor thereof. The threaded sleeve is equivalent to a short circuit between the inner and outer conductors in such a line the location of which, relative to the diode, is variable according to the depth of adjustment of the sleeve into the mounting block. The portion of the rod extending between the end of the sleeve constitutes an inductance connected in series with one electrode of the diode. The inductance is continuously variable, through a limited range, by adjusting the length of penetration of the sleeve into the mounting block.

DESCRIPTION OF THE DRAWINGS

FIG. 1 is a schematic diagram of the tuning circuit of the invention. An IMPATT diode 10 is positioned in a holder providing a variable series inductance 11 between the anode of the diode and ground. The cathode of the diode is connected through an impedance transformer 12 and an impedance matching length of microstrip 13 to node 14. A variable capacitor 15 is connected between node 14 and ground. A resistor 16 having a value equal to $Z_0$, the characteristic impedance of the microstrip, is connected between node 14 and a half-wave stub 17 of microstrip. Node 14 is connected to node 19 through a half-wave section 18 of microstrip. A load 20, is connected to node 19 through a d.c. blocking capacitor 21. Load 20 may comprise an input terminal to a microstrip hybrid junction when the outputs of two diodes are combined for increased power. Bias in the form of d.c. or pulsed d.c. is supplied to diode 10 through a conductor 22 connected from a bias source (not shown) to node 23. A filter comprised by R-C network 24, distributed capacitance 25 and ferrite bead 26 stabilizes against low frequency oscillation in the bias voltage. The bias voltage at node 23 is conducted to node 19 through a quarter-wave section of microstrip 27. From node 19, bias flows through microstrip sections 18, 13 and transformer 12 to diode 10, but is prevented from entering load 20 by blocking capacitor 21.

Figure 1:
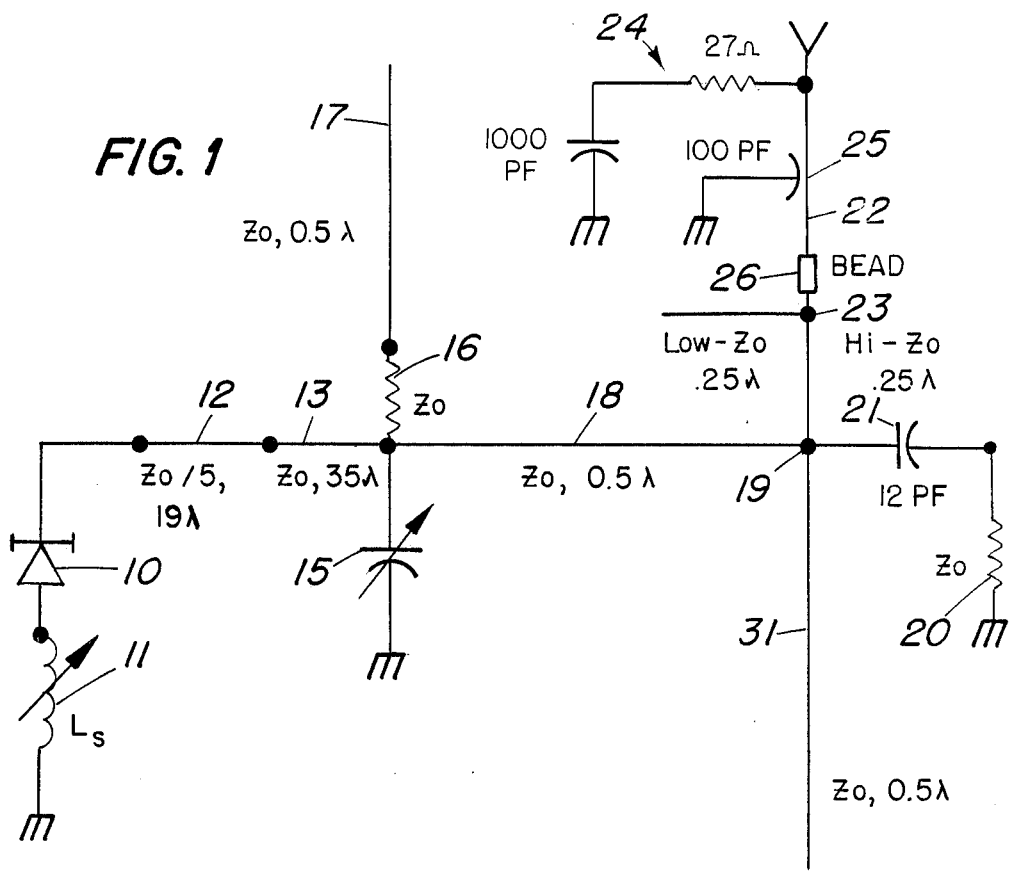
FIG. 1 is a schematic diagram of the tuning circuit of the invention.

A quarter-wave stub of microstrip 30 connected to node 23 and a half-wave stub 31 of microstrip is connected to node 19. Stubs 17 and 31 serve the purpose of suppressing sub-harmonic frequencies which may be generated by diode 10 when oscillating at its operating frequency.

At operating frequency, stubs 17 and 31 are open circuits. Resistor 16 has no effect on the impedance at node 14 and line 18 translates the impedance at node 19 to node 18 without change. Stub 30 presents a short circuit at node 23. The short circuit at node 23 is translated by line 27 to an open circuit at node 19. Thus, none of the power at the operating frequency is diverted from node 19 to node 23.

At half the operating frequency, stub 17 becomes a quarter-wave line thereby effectively connecting resistor 16 to ground. Line 18 and stub 31 likewise become quarter-wave lines, with stub 31 effectively placing a short circuit at node 19 which line 18 translates to an open circuit at node 14. Thus half frequency oscillations are absorbed in resistor 16 and blocked from entering load 20.

Figure 2:
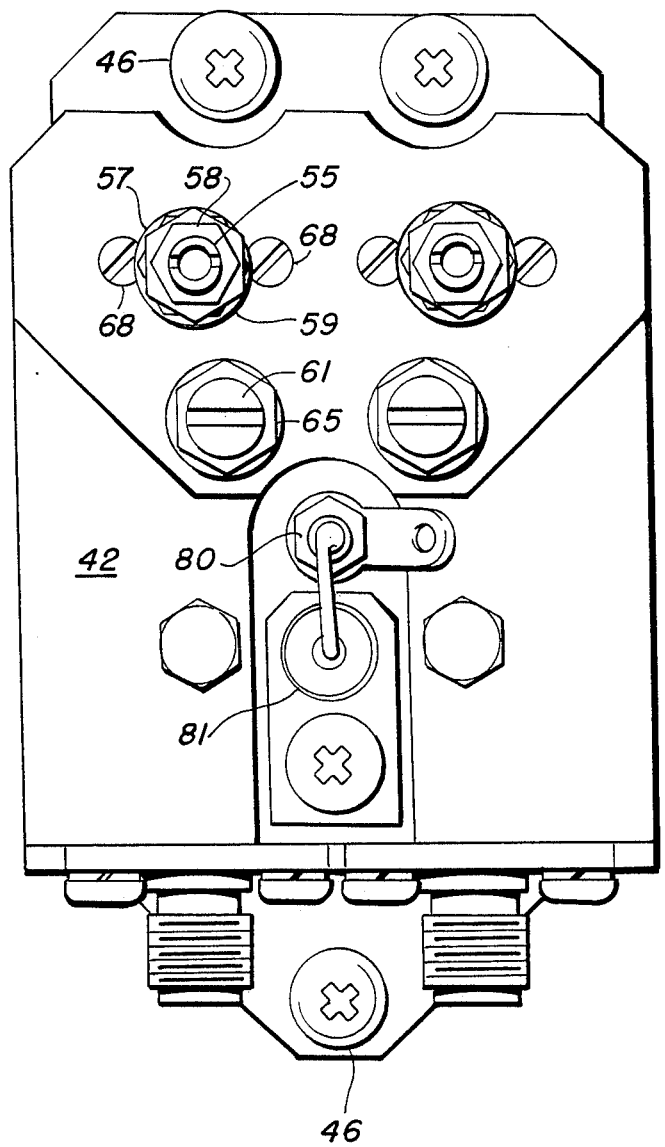
FIG. 2 is a top view of an embodiment of the invention which includes means for combining the outputs of two identical tuning circuits, as shown in FIG. 1, for increased power.
Figure 3:
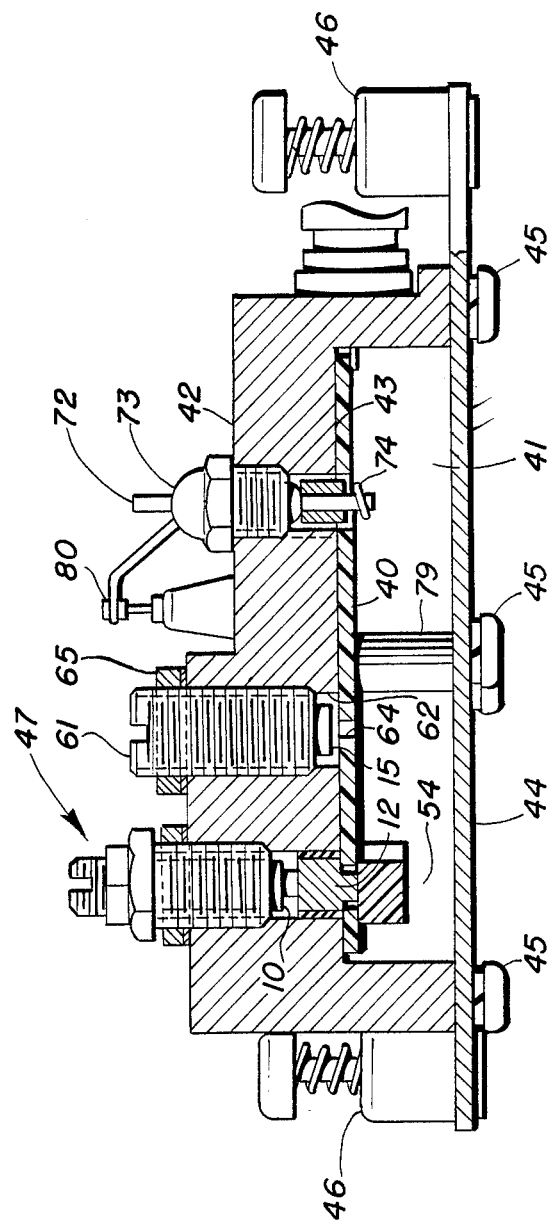
FIG. 3 is a section taken along the line 3—3 of FIG. 4.
Figure 4:
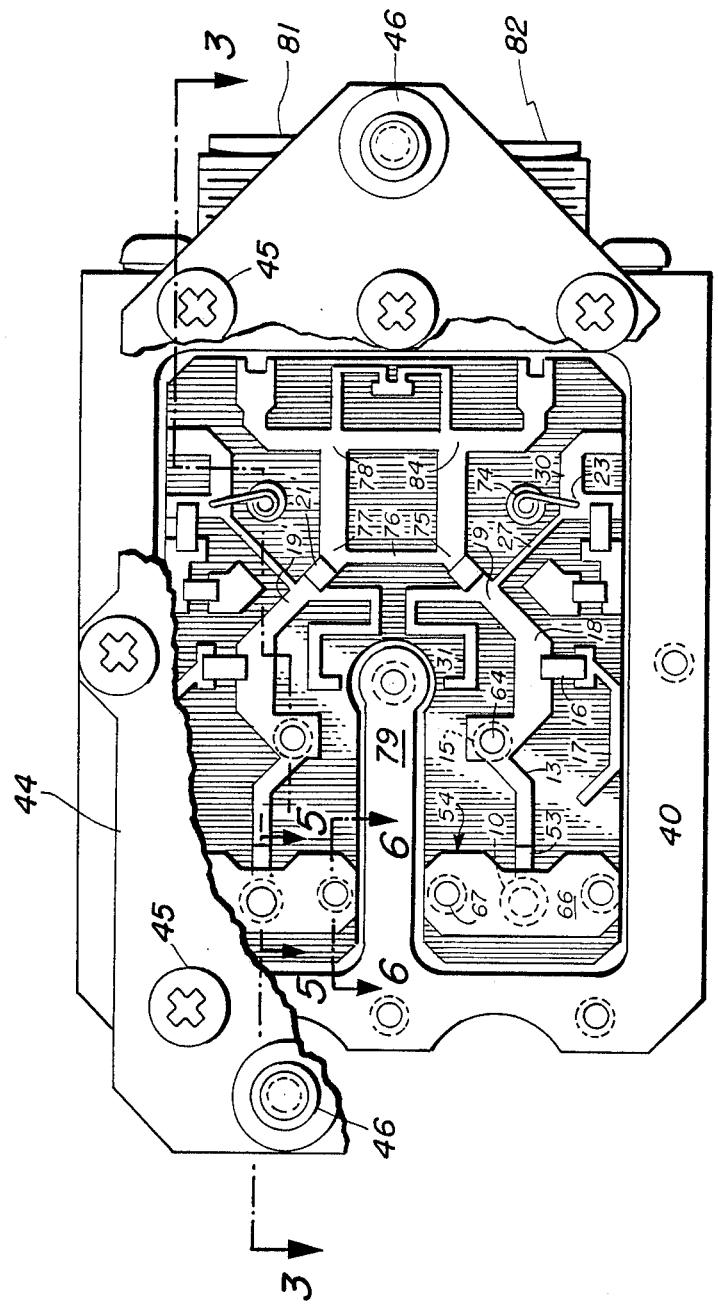
FIG. 4 is a bottom view, with portions thereof broken away, of FIG. 2.

FIGS. 2, 3 and 4 are respectively, top, sectional and bottom views of a practical embodiment of the tuner circuit of FIG. 1 in which the outputs of two such circuits may be combined for increased power output.

Referring to FIG. 4, the transmission lines of FIG. 1 are laid out as a pattern of conductive tracks supported on a board 40 of insulating material. The various lines of FIG. 1 are identified by like reference characters in FIG. 4. The track widths vary along the pattern as may be necessary to achieve the proper line impedance for a particular line length.

Board 40 is supported within a downward facing well 41 formed in a housing 42 (FIG. 3). Surface 43 of the well forms the ground plane for the conductive tracks on the opposite surface of the board. The open face of well 41 is covered by a bottom plate 44 secured in place by screws 45. Captive mounting screws 46 located along edges of plate 44 are provided for mounting the assembly to a chassis (not shown).

Figure 5:
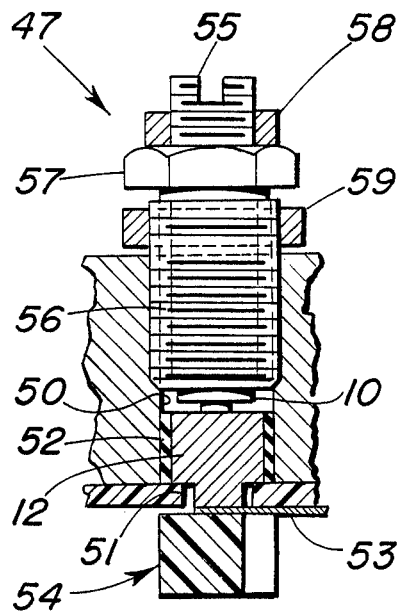
FIG. 5 is a section taken along the line 5—5 of FIG. 4.

Referring to FIGS. 3 and 5, diode 10 is mounted in a holder 47 which includes tuning inductance 11. A threaded hole 50, centered above the end of a conductive ribbon 53 (later described) soldered to track portion 13, extends completely through housing 42. A hole 51, on the same center as hole 50 but of smaller diameter, extends through board 40. Transformer 12 comprises a stepped metal cylinder covered with a dielectric shell 52. Transformer 12 fits snugly in hole 50 with the stepped portion thereof extending through hole 51 to the tracked surface of board 40. Ribbon 53, soldered at one end to track portion 13 and forming an extension thereof, contacts the end of the stepped portion of transformer 12. Ribbon 53 is held in contact with transformer 12 by a spring loaded dielectric clamp 54, later more fully described.

Diode 10 is mounted to the end of a theaded conductive rod 55. Rod 55 is threaded into an internally-externally threaded sleeve 56 which, in turn, is threaded into hole 50. By adjusting the depth to which sleeve 56 is threaded into hole 50, the length of rod 55 extending beyond the lower end of sleeve 56 is varied. This portion of the length of rod 55 constitutes the tuning inductance 11 of FIG. 1. The top end of sleeve 56 is finished with a hexagonal head 57 to facilitate adjustment of the sleeve depth. Jamb nuts 58, 59 are threaded, respectively, onto rod 55 and sleeve 56.

Again referring to FIG. 3, adjustable capacitor 15 is comprised of a conductive rod 61, the end portion of which is stepped down in diameter, threaded into a hole 62 extending through housing 42. Hole 62 is centered over a plated-through hole 64 extending from an area on the circuit track near node 14 to an isolated pad on the opposite surface of board 40. A jamb nut 65 is threaded onto the upper end of rod 61.

Figure 6:
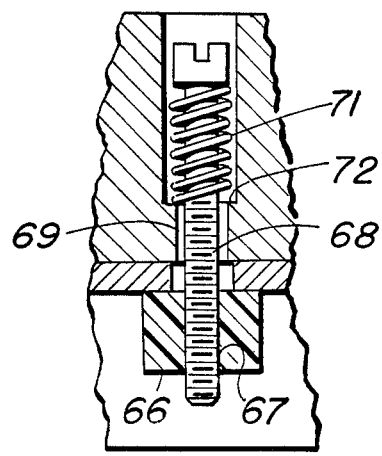
FIG. 6 is a section taken along the line 6—6 of FIG. 4.

Referring to FIGS. 4 and 6, clamp 54 comprises a bottom piece 66 of dielectric material extending over ribbon 53 to beyond the edges of hole 50. Threaded holes 67 are located at the opposite ends of piece 66 for receiving screws 68. Each of the screws 67 extend through a stepped clearance hole 69 in housing 42 and a hole in board 40 into threaded hole 67. A helical spring 71 fitted over the upper end of screw 68 bears at its lower end on the shoulder 72 of hole 69 and bears at its upper and on the head of screw 68. The screws 68 are threaded into piece 66 a length sufficient to compress the springs 71 adequately to maintain ribbon 53 in contact with transformer 12.

Referring to FIGS. 3 and 4, bias is supplied from a bias source through a cable (not shown) connected to conductor 22 of a feed through filter 73. Ferrite bead 26 is positioned over the lower end of conductor 22 within the hole in housing 42 into which filter 73 is threaded. A jumper wire 74 soldered to the lower end of insulator 22 and to node 23 of the circuit track completes the connection from conductor 22 to the circuit track and diode 10.

Tuning of the circuit is straightforwardly accomplished. With jamb nuts 58, 59, 65 loosened, rod 55 is held stationary with diode 10 in contact with transformer 12 while the positions of sleeve 56 and rod 61 are adjusted for proper tuning. Thereafter, nuts 58, 59, 65 are tightened to hold sleeve 56 and rod 61 in position.

The drawings illustrate an assembly of two substantially identical IMPATT diode tuning circuits in which the outputs of the tuning circuits may be combined in a hybrid junction for increased power output. The only difference between the tuning circuits is that the track pattern of one is the mirror image of the track pattern of the other. The output of the lower tuning circuit, appearing at node 19, is coupled through capacitor 21 to one input port 75 of a hybrid junction 76. The output of the upper tuning circuit, appearing at node 19', is coupled through capacitor 21' to a second input port 77 of junction 76. A wall 79 of housing 42 extends partially between the tuning circuits to provide increased isolation therebetween.

Hybrid junction 76 is of a form known in the art. With phase coherence between the input signal at ports 75, 77, the input signals will combine at one or the other of the junction output ports 78, 84 and the total will appear at that output port while none appears at the other output port. To provide phase coherence between the input signals to the hybrid an injection lock signal is applied to the hybrid through one or the other output ports. The combined signals at the hybrid input ports then appears at the other hybrid output port. Assuming that an injection lock signal from an external source (not shown) is applied through coaxial connector 81 to port 78, then the combined signals at ports 75, 77 appear at output port 84 whence the combined signal is conducted through coaxial connector 82.

Shown in FIG. 2, and partially in FIG. 3, are a standoff insulator 80 and a thermister 81 mounted on housing 42 to sense the temperature thereof. Thermister 81 provides a signal to the bias source for compensating the bias current in accordance with variations in the housing temperature.

The invention claimed is:

1. A tuner for combining a microwave diode, a variable inductor and a variable capacitor into a resonant circuit, the impedance of which is matched to the impedance of a microwave transmission line, comprising
   a microstrip transmission line including an insulating substrate, a conductive circuit track on one surface of said substrate and a ground plane on the surface of said substrate opposite said one surface thereof;
   a microwave diode holder of coaxial form including an outer conductor, a center conductor and a sleeve extending partially over the length of said center conductor and supporting said center conductor axially within said outer conductor, said outer conductor being conductively connected to said ground plane,
   said sleeve being conductively connected to said center conductor and said outer conductor and being longitudinally adjustable along the length of said center conductor;
   a microwave diode having anode and cathode electrodes, one of said electrodes being conductively connected to that end of said center conductor within said outer conductor and extending beyond said sleeve;
   impedance matching means having an impedance value intermediate between the impedance value of said diode and the characteristic impedance value of said circuit track for conductively connecting the other electrode of said diode to said circuit track; and
   an adjustable capacitor connected between said ground plane and said circuit track at a point on said circuit track beyond said impedance matching means.

2. A tuner as claimed in claim 1 wherein said ground plane of said transmission line comprises:
   a conductive housing coextensive with said insulating substrate of said transmission line, said insulating substrate being secured to one surface of said housing.

3. A tuner as claimed in claim 2 wherein said microwave diode holder extends perpendicularly to said one surface of said housing.

4. A tuner as claimed in claim 2 wherein said adjustable capacitor comprises:
   means providing a conductive path from said point on said circuit track through said transmission line substrate to a point on said opposite surface of said substrate opposite said point on said conductive track;
   an aperture in said housing defining a clearance area surrounding said point on said opposite surface of said substrate; and
   a conductor extending into said aperture and in electrical contact with said housing, said conductor being adjustable axially within said aperture to vary the distance between said conductor and said point on said opposite surface of said substrate.

5. A tuner for combining a microwave diode, a variable inductor and a capacitor into a resonant circuit, the impedance of which is matched to the characteristic impedance of a microwave transmission line, comprising:
   a microstrip transmission line including a planar insulating substrate and a linear conductive circuit track on one surface of said substrate;
   a conductive housing having one surface thereof coextensive with said substrate, said substrate being supported by said housing with the surface of said substrate opposite said one surface thereof being adjacent to said one surface of said housing;
   a second threaded aperture extending through said housing concentrically with said first aperture of said substrate;
   an impedance transformer seated in said second aperture, said transformer being insulated from electrical contact with the wall of said second aperture, a portion of said transformer extending through said first aperture and electrically contacting said one end of said circuit track;
   an internally-externally threaded conductive sleeve threaded into said aperture above said impedance transformer;
   a first threaded conductive rod threaded through said sleeve and extending into said said second aperture;
   a microwave diode mounted on the end of said first rod extending into said second aperture with one electrode of said diode in electrical contact with said first rod and with the other electrode of said diode in contact with said transformer whereby the portion of said first rod extending beyond said sleeve into said second aperture constitutes an inductor connected in series with said diode, the inductance of which is variable in accordance with the depth to which said sleeve is threaded into said second aperture; and
   a capacitor for resonating with said inductor, said capacitor being connected to a first point on said circuit track at a first location beyond said one end of said circuit track.

6. A tuner as claimed in claim 5 wherein said capacitor is variable.

7. A tuner as claimed in claim 6 wherein said capacitor comprises:
   a conductor extending through said substrate to a second point on said substrate opposite said first point on said circuit track;
   a third, threaded aperture in said housing, said third aperture being concentric with said second point and providing a clearance area in said housing surrounding said second point; and
   a second, threaded rod threaded into said third aperture, said second rod being in electrical contact with the wall of said third aperture, the end of said second rod within said third aperture being spaced from said second point,
   whereby the capacitance of said capacitor is adjustable in accordance with the depth to which said second rod is threaded into said third aperture.

8. A tuner as claimed in claim 5, with additionally:
   a third point on said circuit track at second location on said circuit track beyond said first location thereon;
   means for applying a d.c. bias to said third point; and
   means for blocking the flow of bias current through the end of said circuit track opposite said one end thereof.

9. A tuner as claimed in claim 5, with additionally:
   a first stub of circuit track having one end thereof connected to said first point on said circuit track and the opposite end thereof open circuited, said first stub having a length equal to one half the operating wave length of said microwave diode.

10. A tuner as claimed in claim 9, with additionally:
a resistor having a resistance equal to the characteristic impedance of said circuit track, said resistor being connected in series with said first stub.

11. A tuner as claimed in claim 9, with additionally:
a third point on said circuit track at a second location on said circuit track beyond said first location thereon;
means for blocking the flow of bias current through the end of said circuit track opposite said one end thereof.

12. A tuner as claimed in claim 11, with additionally:
a second stub of circuit track having one end thereof connected to said third point on said circuit track and the opposite end thereof open circuited, said second stub having a length equal to one-half the operating wave length of said microwave diode.

13. A tuner as claimed in claim 12, with additionally:
a third stub of circuit track;
a fourth stub of circuit track;
said third and fourth stubs each having a length equal to one-fourth of the operating wave length of said microwave diode;
said fourth stub having one end thereof connected to one end of said third stub and the other end of said fourth stub open circuited;
said third stub having said one end thereof connected to said fourth stub also connected to said means for applying bias and the other end of said third stub connected to said third point on said circuit track

* * * * *